United States Patent [19]

Sekiya

[11] Patent Number: 4,794,220
[45] Date of Patent: Dec. 27, 1988

[54] ROTARY BARREL TYPE INDUCTION VAPOR-PHASE GROWING APPARATUS

[75] Inventor: Isao Sekiya, Numazu, Japan

[73] Assignee: Toshiba Kikai Kabushiki Kaisha, Tokyo, Japan

[21] Appl. No.: 27,727

[22] Filed: Mar. 19, 1987

[30] Foreign Application Priority Data

Mar. 20, 1986 [JP] Japan .................. 61-62590

[51] Int. Cl.$^4$ .................. H05B 6/40; C23C 16/00
[52] U.S. Cl. .................. 219/10.491; 219/10.67; 219/10.79; 118/730; 118/50.1; 118/500
[58] Field of Search .................. 219/10.49 R, 10.67, 219/10.79, 10.43, 10.491; 118/730, 731, 729, 728, 50.1, 500, 620

[56] References Cited

U.S. PATENT DOCUMENTS

| | | | |
|---|---|---|---|
| 3,384,049 | 5/1968 | Capita .................. | 219/10.49 R X |
| 3,699,298 | 10/1972 | Briody .................. | 219/10.49 R |
| 4,496,828 | 1/1985 | Kusmierz et al. .................. | 118/730 X |
| 4,579,080 | 4/1986 | Martin et al. .................. | 219/10.49 R X |

*Primary Examiner*—Philip H. Leung
*Attorney, Agent, or Firm*—Stevens, Davis, Miller & Mosher

[57] ABSTRACT

A barrel type vapor-phase growing apparatus includes a reaction cylinder with a seal plate provided for sealing the upper end of the reaction chamber. A radio-frequency heating coil is provided in the reaction cylinder. A susceptor is also provided in the reaction cylinder so as to surround the radio-frequency heating coil, and a number of semiconductor wafers supported on the surface of the susceptor are heated by the radio-frequency heating coil. A rotating device is provided on the seal plate, and a suspension member is coupled with the rotating device for suspending and rotating the susceptor within the reaction cylinder such that the upper end of the susceptor is held at a position lower than the upper end of the radio-frequency heating coil.

15 Claims, 4 Drawing Sheets

ROTARY BARREL TYPE INDUCTION VAPOR-PHASE GROWING APPARATUS

BACKGROUND OF THE INVENTION

This invention relates to a barrel type vapor-phase growing apparatus wherein semiconductor layers and the like are simultaneously grown on a large number of substrates, and the temperatue distribution in the apparatus can be substantially improved.

Barrel type vapor-phase growing apparatus utilizing radio-frequency heating have been disclosed, for instance, in U.S. Pat. Nos.: 3,424,629; 3,645,230; and 4,496,828.

The apparatus disclosed in the U.S. Pat. No. 3,424,629 utilizes a radio-frequency heating coil wound on the outside of a susceptor. The apparatus of this patent involves difficulties that the distance between the susceptor and the heating coil cannot be reduced and that infrared-ray lamps and the like cannot be provided outside of the susceptor.

In the apparatus disclosed in U.S. Pat. No. 3,645,230, the RF coil is provided on the inside of the susceptor of a cylindrical configuration and opening upwardly and downwardly, and having a lower end supported by a supporting member. This type of growing apparatus involves difficulties that the construction of the supporting member becomes complicated because the susceptor must be rotated while preventing the leakage of reaction gas from a reaction chamber.

On the other hand, in a barrel type vapor-phase growing apparatus disclosed in U.S. Pat. No. 4,496,828, a susceptor having a top plate and a slide plate is suspended by a shaft depending from an upper position.

In still another conventional apparatus shown in FIG. 1, a susceptor 1 of a truncated polygonal cone shape and having a top plate 2 is suspended by a hanger 3, and a radio-frequency heating coil 4 is provided internally of the susceptor 1.

As a consequence, when the susceptor 1 is heated by the heating coil 4, since the top plate 2 is provided at the top of the susceptor 1, the upper end of the heating coil 4 is brought into a position lower than the upper end of the susceptor 1. Thus the temperature at the upper end portion of the susceptor 1 is reduced as indicated by T1 in FIG. 2 because of the heat dissipation toward the top plate 2, and a temperature gradient of a comparatively wide range starting from the upper end of the susceptor has been exhibited at the upper end of the susceptor 1.

The temperature gradient inevitably restricts the mounting area of wafers W, thus reducing the productivity of the growing apparatus. Furthermore, since the upper end portion of the susceptor 1 is ordinarily cooled by a reaction gas and a purging gas, it is advantageous to heat the end portion to a temperature higher than the intermediate portion for avoiding further increase of the temperature drooping region.

SUMMARY OF THE INVENTION

An object of the present invention is to provide a barrel type vapor-phase growing apparatus wherein the temperature distribution in the susceptor subjected to a radio-frequency heating is made substantially uniform.

Another object of the invention is to provide a barrel type vapor-phase growing apparatus wherein the wafer mounting area of the susceptor can be increased, and the productivity of the apparatus can be increased.

These and other objects of the invention can be achieved by a barrel type vapor-phase growing apparatus comprising a reaction cylinder, a seal plate provided for sealing an upper end of the reaction cylinder, a radio-frequency heating coil provided in the reaction cylinder, a susceptor provided in the reaction cylinder in a manner surrounding the radio-frequency heating coil, so that a number of semiconductor wafers are supported and heated on the surface of the susceptor, rotating means provided on the seal plate, and a suspension means coupled with the rotating means for suspending and rotating the susceptor within the reaction cylinder at a position where the upper end of the susceptor is held lower than an upper end of the radio-frequency heating coil.

The susceptor may be formed into a truncated polygonal cone shape, and the suspension means may comprise a hanger coupled with the rotating means, a top plate coupled with the lower end of the hanger, and a suspension ring engaged with a peripheral portion of the top plate.

DESCRIPTION OF THE PREFERRED EMBODIMENTS

Figure 3:
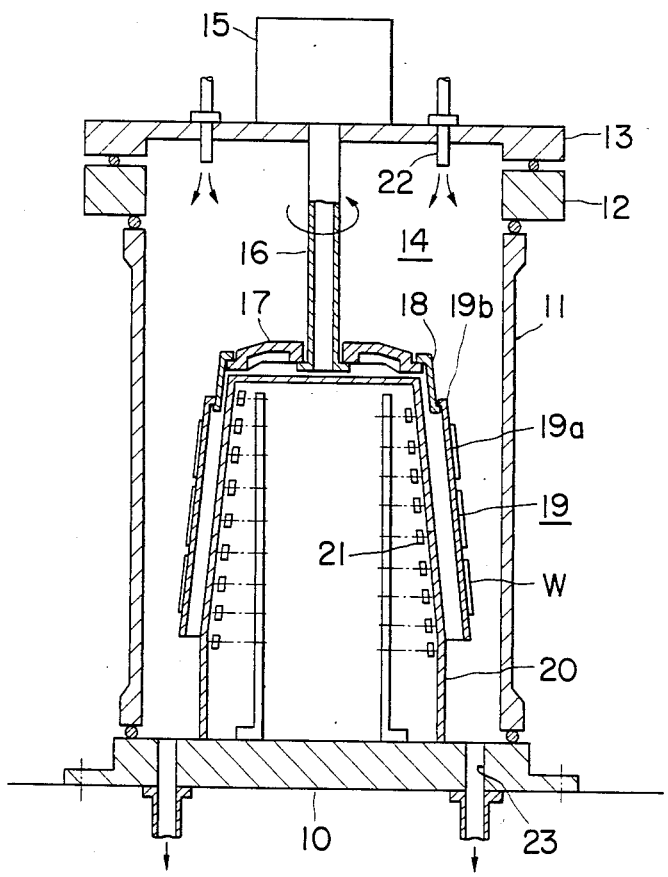
FIG. 3 is a vertical sectional view showing a preferred embodiment of the invention.

A preferred embodiment of the present invention is illustrated in FIG. 3. In this embodiment, a reaction cylinder 11 is secured to the upper surface of a base plate 10. A seal plate 13 is secured to the upper end of the reaction cylinder 11 with a seal ring 12 interposed therebetween so that a space defined by the base plate 10, reaction cylinder 11, and the seal plate 13 provides a reaction chamber 14.

On the seal plate 13 is provided a rotating device 15 which rotates a hanger 16 coupled to a rotating shaft (not shown) of the rotating device 15, for example a motor. The hanger 16 is made of a heat-resisting and contamination-proof material of a low heat conductivity, such as a quartz glass and silicon nitride ($Si_3N_4$) and extends downwardly into the reaction chamber 14. A lower end of the hanger 16 is expanded into a flange-like configuration. A top plate 17 made of carbon or quartz is supported by the flange-shaped lower end of the hanger 16. A susceptor 19 made of carbon, for example, is suspended via a suspension ring 18 from the top plate 17. The suspension ring 18 may be made of a heat-resisting contamination-proof material such as quartz glass, silicon nitride ($Si_3N_4$) and carbon, preferably the quartz glass and silicon nitride ($Si_3N_4$) which are of low heat conductivity. The lower end of the suspension ring 18 engaging with the upper end of the susceptor 19 is formed into a cylindrical or a polygonal pillar shape.

The susceptor 19 comprises a side wall 19a of a polygonal cone shape and a flange portion 19b which engages with the lower end of the suspension ring 18.

A coil cover 20 made of quartz glass and formed into a bell shape is placed within the susceptor 19, on the upper surface of the base plate 10. A radio-frequency heating coil 21 is provided inside of the coil cover 20.

According to the invention, the lower end of the suspension ring 18 is extended to a position lower than the upper end of the heating coil 21 by a distance corresponding to that of from one to two turns of the coil 21. That is, the upper end of the susceptor 19 supported by the suspension ring 18 is brought into a position lower than the upper end of the coil 21 by a distance corresponding to one to two turns of the coil 21. Furthermore, the lower end of the heating coil 21 is held at a position lower than the lower end of the susceptor 19 by a distance corresponding to one to two turns of the heating coil 21.

Nozzles 22 for supplying a reaction gas and a purge gas are provided through the seal plate 13, while exhaust ports 23 are provided through the base plate 10.

Figure 1:
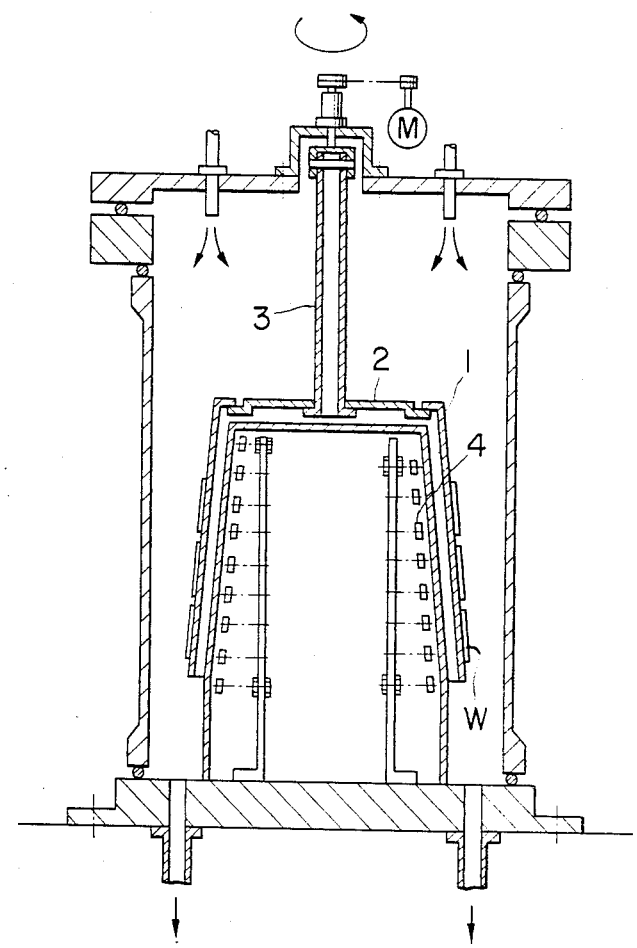
FIG. 1 is a vertical sectional view of a conventional barrel type vapor phase growing apparatus.
Figure 2:
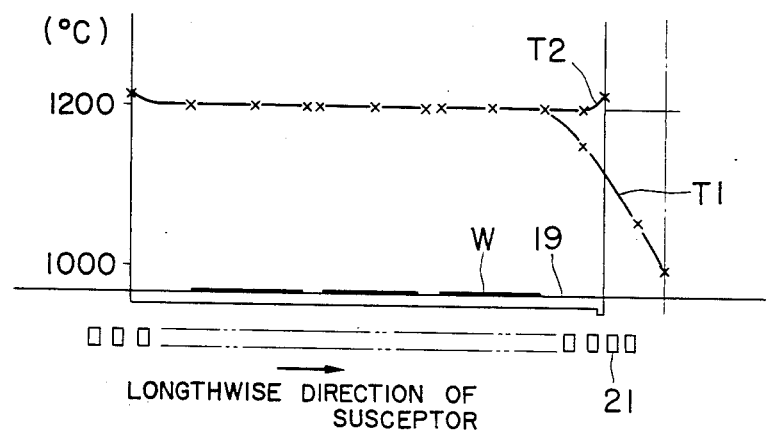
FIG. 2 is a graphical representation showing the distributions of temperature along the length of the susceptor of FIG. 1 and also of this invention.

The operation of the apparatus of the embodiment will now be described. The susceptor 19 is heated by a radio-frequency heating energy applied to the heating coil 21. Since the heating coil 21 extends to cover the entire length of the susceptor 19, and the upper and lower ends of the coil 21 project beyond the upper and lower ends of the susceptor 19, respectively, the temperature of the susceptor 19 can be distributed as indicated by a curve T2 in FIG. 2 when the pitch and the projecting distances of the coil 21 at both ends thereof are selected suitably. More specifically, the difficulty of the conventional apparatus of reducing the temperature at the upper end of the susceptor 19 can be eliminated, and it may also be so constructed that the temperature of the upper end is higher than that of the middle portion of the susceptor 19. In this manner, the drooping tendency of temperature at the end of the susceptor 19 can be prevented, and an even distribution of the temperature can be assured throughout the entire length of the susceptor 19.

In a case where the suspension ring 18 is made of carbon having a comparatively high heat conductivity, since the susceptor 19 and the ring 18 are separated from each other, the conduction of heat between the two members 18 and 19 can be substantially reduced. Furthermore, the lower end of the suspension ring 18 is positively heated by the upper portion of the heating coil 21, and therefore the dissipation of heat from the susceptor 19 to the suspension ring 18 can be substantially reduced.

The top plate 17 provided upwardly of the susceptor 19 may otherwise be made of a quartz glass or silicon nitride ($Si_3N_4$) of insulating property.

Figure 4:
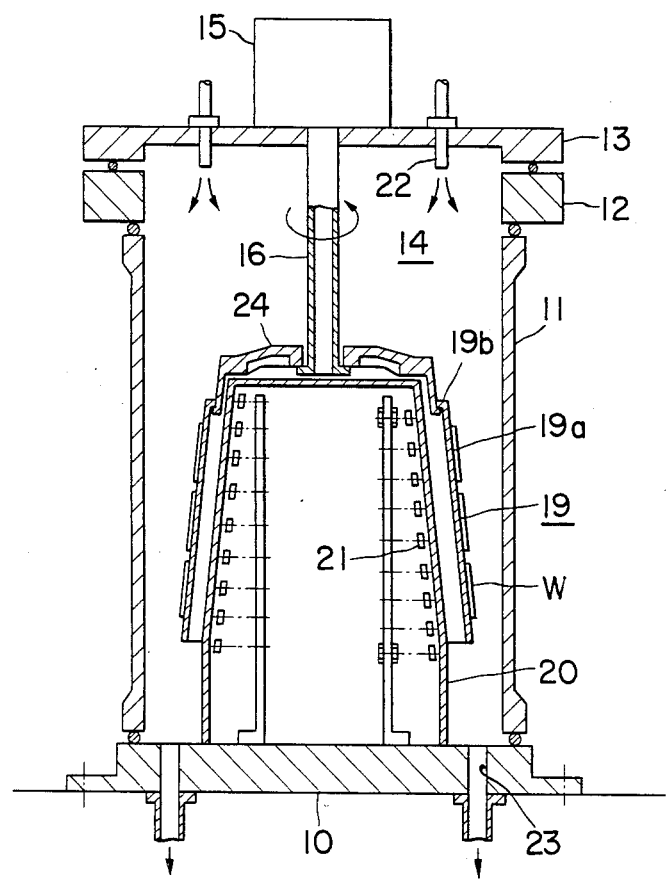
FIG. 4 is a vertical sectional view showing another embodiment of the invention.

Another embodiment of the present invention is illustrated in FIG. 4. In this embodiment, an upper cover member 24 is provided instead of the top plate 17 and the suspension ring 18 of the aforementioned embodiment. The upper cover member 24 is preferably made of a heat-resistant and contamination-proof insulating material such as quartz glass or silicon nitride ($Si_3N_4$). The member 24 is supported by a flange portion of the hanger 16. The susceptor 19 is suspended from an engaging portion of the upper cover member 24 such that the upper end of the susceptor 19 is maintained at a position lower than the upper end of the radio-frequency heating coil 21.

Figure 5:
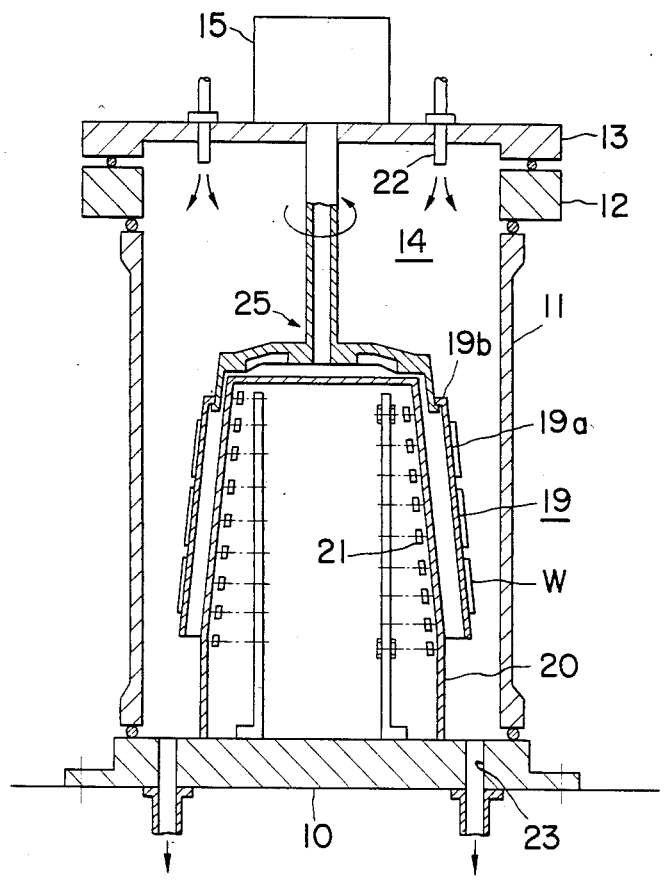
FIG. 5 is a vertical sectional view showing still another embodiment of the invention.

Still another embodiment of the invention is illustrated in FIG. 5. In this embodiment, a suspension means 25 is provided instead of the hanger 16, top plate 17 and the suspension ring 18. The suspension means 25 is made of a heat-resistant, contamination-proof, insulating material of a comparatively low heat conductivity such as quartz glass or silicon nitride ($Si_3N_4$). The upper end of the suspension means 25 is coupled with the rotating shaft of the driving motor 15. The susceptor 19 of this embodiment is suspended from an engaging portion of the suspension means 25 such that the upper end of the susceptor 19 is maintained at a position lower than the upper end of the radio-frequency heating coil 21.

What is claimed is:

1. A rotary barrel type induction vapor-phase growing apparatus comprising:
   a reaction cylinder;
   a seal plate for sealing an upper end of said reaction cylinder;
   a radio-frequency heating coil having an upper end, the heating coil being provided in said reaction cylinder;
   a susceptor having an upper end, the susceptor being provided in said reaction cylinder to surround said radio-frequency heating coil, so that a number of semiconductor wafers are supported and heated on a surface of said susceptor;
   a rotating means provided on said seal plate; and
   a suspension means for suspending and rotating said susceptor within said reaction cylinder at a position where the upper end of the susceptor is held lower than the upper end of said radio-frequency heating coil, which comprises a hanger having an upper and a lower end, the upper end coupled with said rotating means, and an upper cover member supported by the lower end of said hanger and having a peripheral portion extending downwardly, the upper end of said susceptor being secured to the peripheral portion of said upper cover member.

2. The barrel type vapor-phase growing apparatus according to claim 1, wherein said hanger and said upper cover member are made of materials having low heat-conductivities.

3. The barrel type vapor-phase growing apparatus according to claim 1, wherein said susceptor is formed into a truncated polygonal cone.

4. The barrel type vapor-phase growing apparatus according to claim 3, wherein said suspension means is made of a material having a low heat-conductivity.

5. The barrel type vapor-phase growing apparatus according to claim 1, wherein said suspension means is made of a material having a low heat-conductivity.

6. A rotary barrel type induction vapor-phase growing apparatus comprising:
   a reaction cylinder;
   a seal plate for sealing an upper end of said reaction cylinder;
   a radio-frequency heating coil having an upper end, the heating coil being provided in said reaction cylinder;
   a susceptor having an upper end, the susceptor being provided in said reaction cylinder to surround said radio-frequency heating coil, so that a number of semiconductor wafers are supported and heated on a surface of said susceptor;
   a rotating means provided on said seal plate; and
   a suspension means for suspending and rotating said susceptor within said reaction cylinder at a position where the upper end of the susceptor is held lower than the upper end of said radio-frequency heating coil, which comprises a hanger having an upper end coupled with said rotating means, a top plate coupled with a lower end of said hanger, and a suspension ring engaged with a peripheral portion of said top plate, and the upper end of said susceptor is secured to the peripheral portion of said suspension ring.

7. The barrel type vapor-phase growing apparatus according to claim 6, wherein said susceptor is formed into a truncated polygonal cone, said top plate is formed into a circle and said suspension ring is formed into a cylindrical configuration.

8. The barrel type vapor-phase growing apparatus according to claim 7, wherein said suspension ring is made of carbon.

9. The barrel type vapor-phase growing apparatus according to claim 7, wherein said suspension ring is made of a material having a low heat-conductivity.

10. The barrel type vapor-phase growing apparatus according to claim 7 wherein said hanger and said top plate are made of materials having low heat-conductivities, and said suspension ring is made of carbon.

11. The barrel type vapor-phase growing apparatus according to claim 7 wherein said hanger, said top plate and said suspension ring are made of materials having low heat-conductivities.

12. The barrel type vapor-phase growing apparatus according to claim 6, wherein said suspension ring is made of carbon.

13. The barrel type vapor-phase growing apparatus according to claim 6, wherein said suspension ring is made of a material having a low heat conductivity.

14. The barrel type vapor-phase growing apparatus according to claim 6, wherein said hanger and said top plate are made of materials having low heat conductivities, and said suspension ring is made of carbon.

15. The barrel type vapor-phase growing apparatus according to claim 6, wherein said hanger, said top plate and said suspension ring are made of materials having low heat-conductivities.

* * * * *